US006983532B2

(12) United States Patent
White

(10) Patent No.: US 6,983,532 B2
(45) Date of Patent: Jan. 10, 2006

(54) IN-LINE PROGRAM SYSTEM FOR ASSEMBLY PRINTED CIRCUIT BOARD

(75) Inventor: William H. White, Houston, TX (US)

(73) Assignee: BP Microsystems, Houston, TX (US)

( * ) Notice: Subject to any disclaimer, the term of this patent is extended or adjusted under 35 U.S.C. 154(b) by 0 days.

(21) Appl. No.: 10/770,913

(22) Filed: Feb. 2, 2004

(65) Prior Publication Data

US 2004/0163241 A1  Aug. 26, 2004

Related U.S. Application Data

(60) Division of application No. 09/776,095, filed on Feb. 1, 2001, now Pat. No. 6,687,986, which is a continuation of application No. 09/493,953, filed on Jan. 28, 2000, now Pat. No. 6,230,067.

(60) Provisional application No. 60/117,873, filed on Jan. 29, 1999.

(51) Int. Cl.
*B23P 19/00* (2006.01)
(52) U.S. Cl. ............................ 29/740; 29/33 P; 29/703; 29/705; 29/711; 29/721; 29/742; 414/757; 414/935; 700/121
(58) Field of Classification Search .......... 29/701–703, 29/705, 711, 721, 740–743, 832, 834, 836, 29/837, 33 P; 200/96, 112, 192; 209/565, 209/576; 324/765, 766; 700/99–103, 112, 700/113, 121, 214, 230; 901/47, 46; 198/341.03, 198/347.1
See application file for complete search history.

(56) References Cited

U.S. PATENT DOCUMENTS

| | | | |
|---|---|---|---|
| 3,975,261 A | | 8/1976 | Beck |
| 4,128,174 A | | 12/1978 | Frisbie et al. |
| 4,763,405 A | | 8/1988 | Morita et al. |
| 5,168,218 A | | 12/1992 | Rich |
| 5,208,976 A | | 5/1993 | Bess et al. |
| 5,313,156 A | | 5/1994 | Klug et al. |
| 5,330,043 A | | 7/1994 | Stuckey |
| 5,466,117 A | * | 11/1995 | Resler et al. ............... 414/799 |
| 5,479,694 A | | 1/1996 | Baldwin |
| 5,894,218 A | | 4/1999 | Farnworth et al. |
| 5,996,004 A | | 11/1999 | White |
| 6,313,652 B1 | | 11/2001 | Maeng |

* cited by examiner

*Primary Examiner*—Minh Trinh
*Assistant Examiner*—Donghai D. Nguyen
(74) *Attorney, Agent, or Firm*—Townsend and Townsend and Crew LLP; Gerald T. Gray

(57) ABSTRACT

An in-line programming (ILP) system and method for programming and testing programmable integrated circuit devices (PICs) and performing the assembly of printed circuit board assemblies (PCBAs). Printed circuit boards enter and leave the ILP system on a conveyor system. PICs are loaded into the ILP system, and the ILP system automatically programs and tests the PICs and places them onto the PCBs as the PCBs arrive on the conveyor. The programming and testing operations are performed by the same piece of equipment that performs the PCBA assembly operation.

9 Claims, 9 Drawing Sheets

IN-LINE PROGRAM SYSTEM FOR ASSEMBLY PRINTED CIRCUIT BOARD

CROSS REFERENCES TO RELATED APPLICATIONS

This application is a divisional of U.S. patent application Ser. No. 09/776,095, filed Feb. 1, 2001 now U.S. Pat. No. 6,687,986, which is a continuation of U.S. patent application Ser. No. 09/493,953, filed Jan. 28, 2000, now U.S. Pat. No. 6,230,067, entitled "In-Line Programming System and Method," which is related to U.S. Provisional Patent Application Ser. No. 60/117,873 filed Jan. 29, 1999, entitled "N-LINE PROGRAMMING DEVICE WITH SELF TEACHING CAPACITY," and the disclosures of each are hereby incorporated by reference.

BACKGROUND OF THE INVENTION

The present invention generally relates to concurrent automated programming of programmable electronic devices, and more particularly to programming and testing multiple device types and patterns and performing circuit board assembly simultaneously in a single in-line programming device.

In the semiconductor industry, a considerable number of electronic devices such as programmable integrated circuit (PIC) devices are provided by vendors in programmable form with blank memories or unspecified connections between arrays of logic. Users can then custom configure or program the electronic devices to perform their intended function by programming them, transferring or "burning in" a sequence of operating codes into the memory, or by specifying a particular arrangement of gating logic connections.

Numerous manufacturers have developed automated machinery for handling and programming such devices. Such machinery moves blank devices from a source medium (e.g., trays, tubes, tape) to one or more programming sites, carries out the programming operation on each device, and moves programmed devices from the programming sites to an output medium (e.g., trays, tubes, tape). Typical users of automated programming equipment are highly sensitive to system throughput, which is typically measured in correctly programmed devices per hour, and yield, which is typically defined as the percentage of devices which are correctly programmed.

Before any printed circuit board assembly (PCBA) containing a programmable integrated circuit (PIC) can be used, the PIC must be configured, or programmed, so that it may perform its intended function. During programming, a pattern is loaded into the unprogrammed PIC. These patterns may be changed from time to time as the requirements of the function of the PCBA change over time. Also, in some applications, the pattern may be individualized for each PCBA that is assembled.

For years, PICs have been programmed before being assembled onto a printed circuit board using a methodology called off-line programming (OLP). This, however, created some problems in that OLP of the PICs has to be performed prior to assembly. Specialized equipment must also be obtained to perform OLP. Further, OLP has to be scheduled, which may delay the manufacture of PCBAs and create scheduling problems and bottlenecks in the process. Moreover, once the PICs are programmed, they must be stored until the assembly process begins. This storage and related delay typically creates an inventory of programmed PICs. Not only does this inventory cost money, but in the event that a pattern change is required immediately, the inventory of programmed PICs may have to be destroyed, which adds to the cost and creates an additional delay before the assembly of more PCBAs can commence.

To solve these problems, a technique called in-circuit programming (ICP) was developed. ICP allows for a PIC to be programmed after it is placed on a printed circuit board, i.e., after the PCBA is assembled. Thus, the need for an inventory of programmed devices was eliminated, and individualized PICs no longer needed to be matched with the corresponding PCBA because all the PICs are identical (unprogrammed) at assembly time.

However, new problems arose. For example, because it is not feasible to program all PICs in circuit, the designers of the PCBA must choose only devices that are ICP compatible. ICP compatible PICs cost more than similar non-ICP compatible PICs in many cases, so the cost of the PCBA may be higher when using ICP. Additionally, the PCBA design may be more complex to accommodate ICP, so the time to market may be negatively impacted. Furthermore, specialized equipment is required, and software must be written, to perform the programming operation, which also may impact time to market for the PCBA. Since the programming operation may take a number of minutes to perform, a production line may be slowed down waiting for programming to complete. To address this throughput problem, some users may set up several ICP programming stations to service a single PCBA assembly line. However, this solution requires additional equipment, floor space in the factory and capital outlay. Additionally, if the application for the PCBA requires that the PICs be programmed with individualized patterns, it may be necessary to match the individual PICs with their corresponding individual PCBAs. This additional complication adds additional cost and complexity to the assembly operation. Finally, in the event that the PIC fails to program, the entire PCBA will have to be reworked to replace the PIC.

Accordingly, what is needed in the art is a system and methodology for programming PICs and assembling PCBAs without the drawbacks associated with the off-line programming and in-circuit programming techniques.

SUMMARY OF THE INVENTION

Briefly, the invention provides in-line programming techniques for programming and testing any combination of devices and patterns. The techniques of the present invention are useful for programming a variety of types of programmable integrated circuit devices (PICs), including for example, flash memories, EEPROMs, microcontrollers, PLDs, PALs, FPGAs and the like. According to the invention, an in-line programming (ILP) system programs and tests PICs and performs the assembly of printed circuit board assemblies (PCBAs). Printed circuit boards enter and leave the ILP system on a conveyor system. PICs are loaded into the ILP system, and the ILP system automatically programs and tests the PICs and places them onto the PCBs as the PCBs arrive on the conveyor.

The present invention addresses all of the above problems (e.g., costs, complications and delays) by performing the programming and testing operations with the same piece of equipment that performs the assembly operation. Using the techniques of the present invention, PICs are programmed on demand so the need for an inventory of programmed PICs is eliminated, and changes to the program pattern may be incorporated immediately without waste. Any PICs that fail to program are rejected by the ILP system so that bad PICs are never placed onto a PCBA. Because the PCBA does not have to be designed to accommodate an in-circuit programming technique, the PCBA designer is unconstrained in choice of PICs. The ILP system generally programs PICs faster than PICs can be programmed using the in-circuit programming methodology. The ILP system is also able to program a number of devices simultaneously, allowing a PCBA assembly line to produce PCBAs at a faster pace than that at which a single PIC can be programmed. Thus, an assembly line incorporating an ILP system may be smaller and produce PCBAs faster, with higher quality and less expense than an assembly line incorporating an in-circuit programming system. Further, the use of an ILP system in an assembly line allows for PCBAs to be produced less expensively than in an assembly line incorporating programmed PICs from an off-line programming system.

According to an aspect of the present invention, a method of automatically assembling a printed circuit board assembly (PCBA) in an assembly apparatus is provided. The method typically comprises the steps of a) receiving, in the assembly apparatus, a programmable electronic device to be programmed, and b) automatically programming the electronic device in the assembly apparatus. The method also typically includes the steps of c) receiving a printed circuit board in the assembly apparatus, and d) assembling the PCBA in the assembly apparatus by automatically placing the programmed electronic device on the printed circuit board so as to form the PCBA.

According to another aspect of the present invention, an assembly apparatus capable of automatically assembling a printed circuit board assembly (PCBA) is provided. The apparatus typically comprises a means for receiving, in the assembly apparatus, a programmable electronic device to be programmed, and a means for automatically programming the electronic device in the assembly apparatus. The apparatus also typically includes a means for receiving a printed circuit board in the assembly apparatus, and a means for automatically placing the programmed electronic device on the printed circuit board so as to form the PCBA.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DETAILED DESCRIPTION

Figure 1:
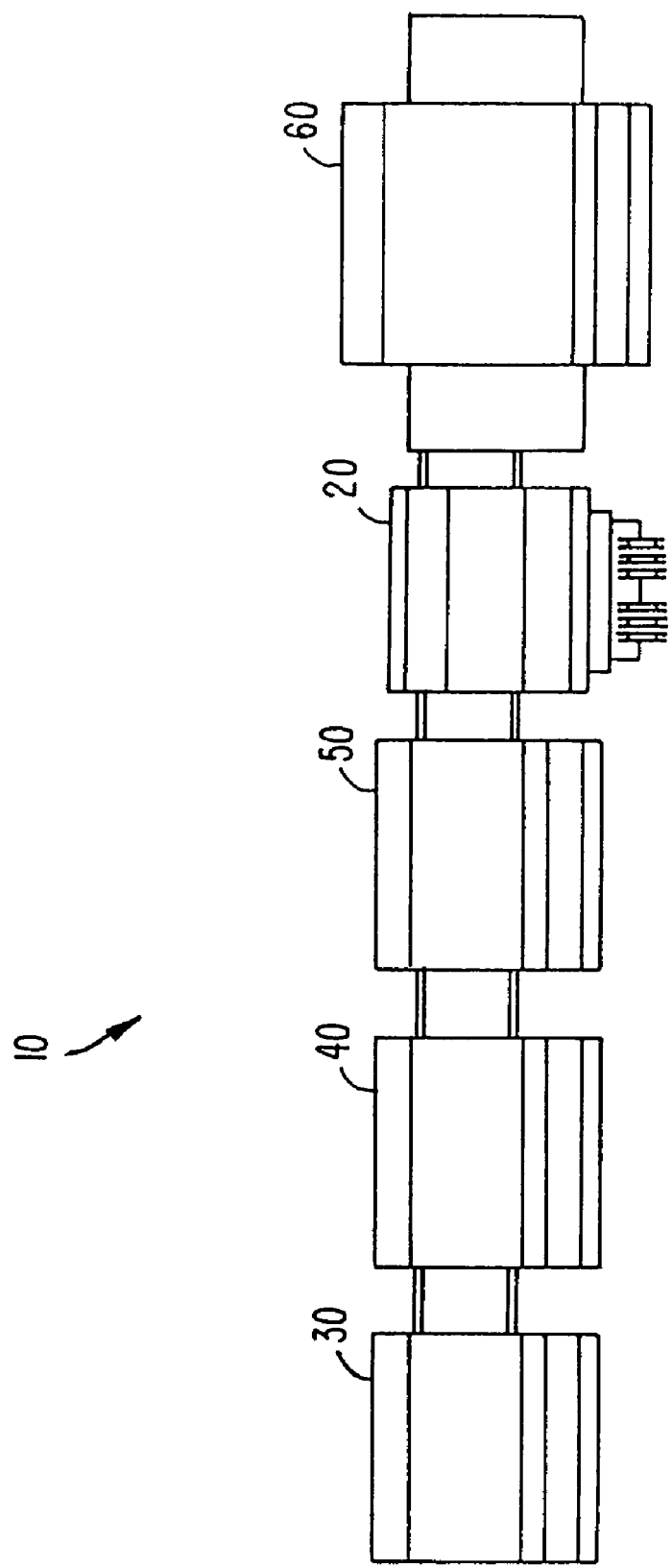
FIG. 1 illustrates a block diagram view of a surface mount production line including an inline programming system according to an embodiment of the present invention.

FIG. 1 illustrates a block diagram view of a surface mount production line 10 including an inline programming apparatus 20 according to an embodiment of the present invention. As shown, surface mount production line 10 includes a linear array of machines or components that perform unique functions. For example, component 30 may be a stencil printer machine 30 that controls the application of solder paste to a blank circuit board. Component 40 may be a chip shooter machine that performs high speed placement of devices and circuit elements that do not require a high level of placement accuracy. Such devices and elements include resistors, capacitors, and the like. Component 50 may be a fine pitch placement machine that places devices at low speed with extreme accuracy. Component 60 may be a reflow oven that "cooks" the solder paste, thereby soldering to the board all the devices and elements that were placed on the board by the previous machines. Each component of production line 10 includes a printed circuit board conveyor for moving printed circuit boards within each machine. The conveyors within each component interface physically and electrically to form one continuous conveyor that allows circuit boards to flow from one end of the line to the other. Circuit boards typically pause within each machine and are locked in place by the conveyor, e.g., using a clamping mechanism, while being subjected to the particular processing that machine is designed to perform.

Figure 2:
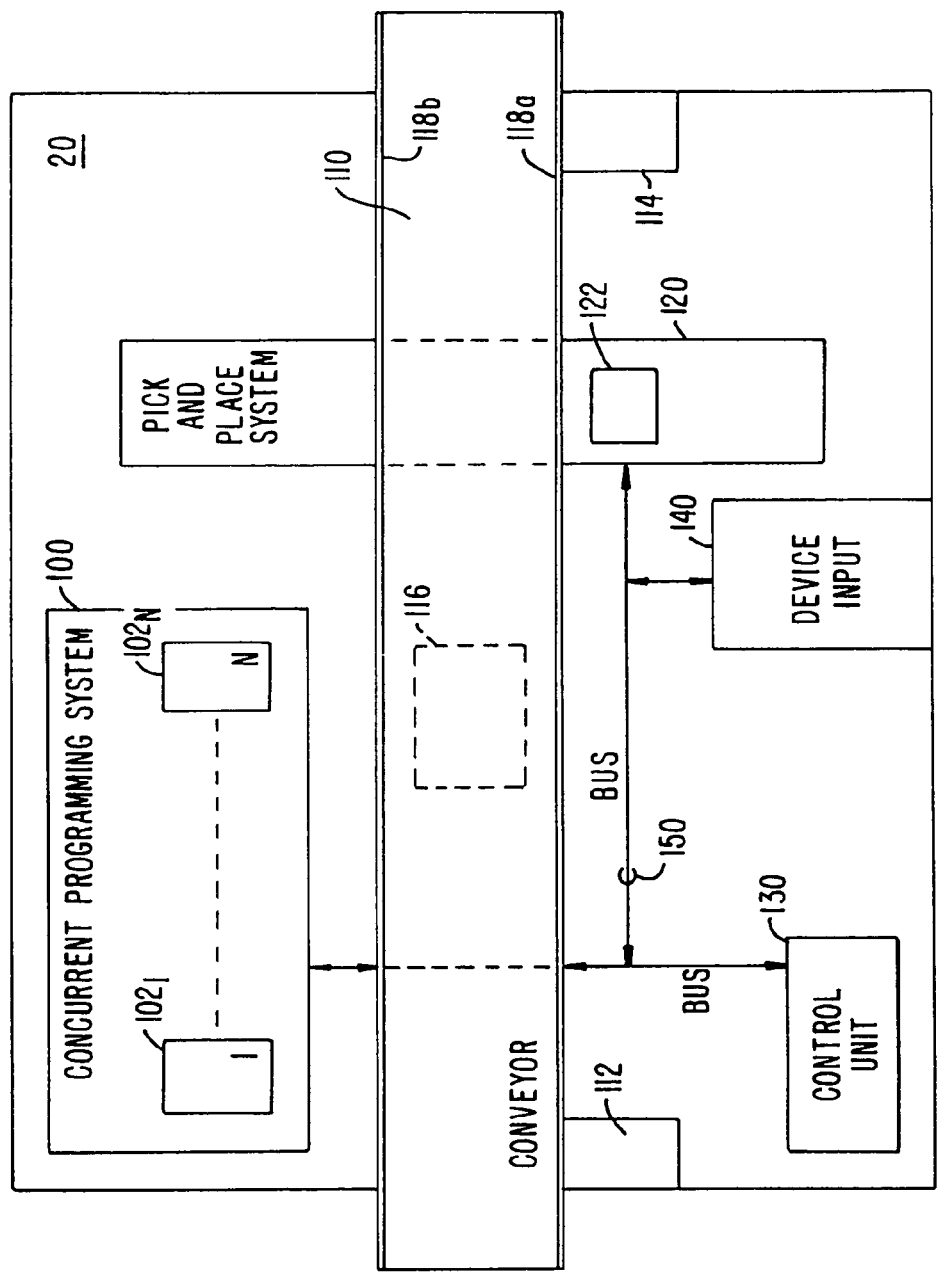
FIG. 2 illustrates a block diagram of an inline programming system according to an embodiment of the present invention.

FIG. 2 illustrates a block diagram of an inline programming apparatus 20 according to an embodiment of the present invention. Inline programming apparatus 20 receives and programs blank programmable devices and places the programmed devices on printed circuit boards as they pass through the apparatus on the conveyor. According to an embodiment of the present invention, the operation of in-line programming apparatus 20 relies on four parallel asynchronous processes. In one embodiment, these processes are embodied in four different components of in-line programming apparatus 20: the concurrent programming subsystem 100, the conveyor subsystem 110, the pick and place subsystem 120, and the central control unit 130. Each component depends on input signals representing events from the other systems. The interdependencies are described in the flow charts illustrated in FIGS. 3–6 as described in more detail below.

Control unit 130 provides overall coordination and control of the various subsystems. Typically, control unit 130 communicates with the various subsystems, and with the upstream and downstream machines in some cases, through one or more busses 150 by sending and receiving control and status signals. Although not shown, each subsystem includes a processor component for controlling functions of the subsystem, and for effecting communication with control unit 130 and with the other subsystems.

Conveyor subsystem 110 receives printed circuit boards from the upstream machine (e.g., fine pitch placement machine 50), moves the board through apparatus 20 and delivers a printed circuit board to the downstream device (e.g., reflow oven 60). Conveyor subsystem 110 includes sensors 112 and 114 as are known in the art for detecting when a board has been received and delivered, respectively. For example, each sensor 112 and 114 detects a trailing edge of the board and signals conveyor subsystem 110 and/or control unit 130. A third sensor (not shown) is also provided just upstream from a processing station location 116 of conveyor subsystem 110.

Device input interface 140 is provided for receiving devices to be programmed from outside of system 20. In one embodiment, device input interface 140 includes a device tray shuttle for receiving a tray holding one or more devices. Other device delivery interfaces may be used as are well known, including interfaces capable of receiving device holding media such as tape, tubes and the like. Pick and place subsystem 120 includes a pick and place head 122 that is capable of picking up the required programmable devices. Pick and place subsystem 120 typically includes tracks or rails 118a and 118b, along which a portion of subsystem 120 is able to move so as to effect movement of head 122 for picking and placing devices within apparatus 20.

Concurrent programming subsystem 100 is responsible for programming devices with the desired program pattern and for testing the programmed devices prior to placement on a printed circuit board. In one embodiment, concurrent programming subsystem 100 includes multiple sites $102_1$ to $102_N$ for concurrently programming and testing multiple devices. An example of such a concurrent programming system can be found in U.S. Pat. No. 5,996,004, assigned to BP Microsystems, Inc., entitled "Concurrent Programming Apparatus and Method for Electronic Devices," the contents of which are hereby incorporated by reference for all purposes. "Programming" a device typically includes transferring or "burning in" a sequence of operating codes into the memory, or by specifying a particular arrangement of gating logic connections (e.g., for a programmable logic array device).

During operation, each programming site of concurrent programming subsystem 100 moves through the following states: EMPTY, WAITING, ACTIVE, READY, and PROMISED. EMPTY indicates that the programming site, or socket, is physically empty. WAITING indicates that the socket is waiting for the pick and place subsystem 120 to deliver a device to be programmed. ACTIVE indicates that a device is in the socket and is being programmed. READY indicates that the socket contains a programmed device. PROMISED indicates that the socket contains a programmed device that has been "promised" to conveyor subsubsystem 110 for assembly.

Figure 3A:
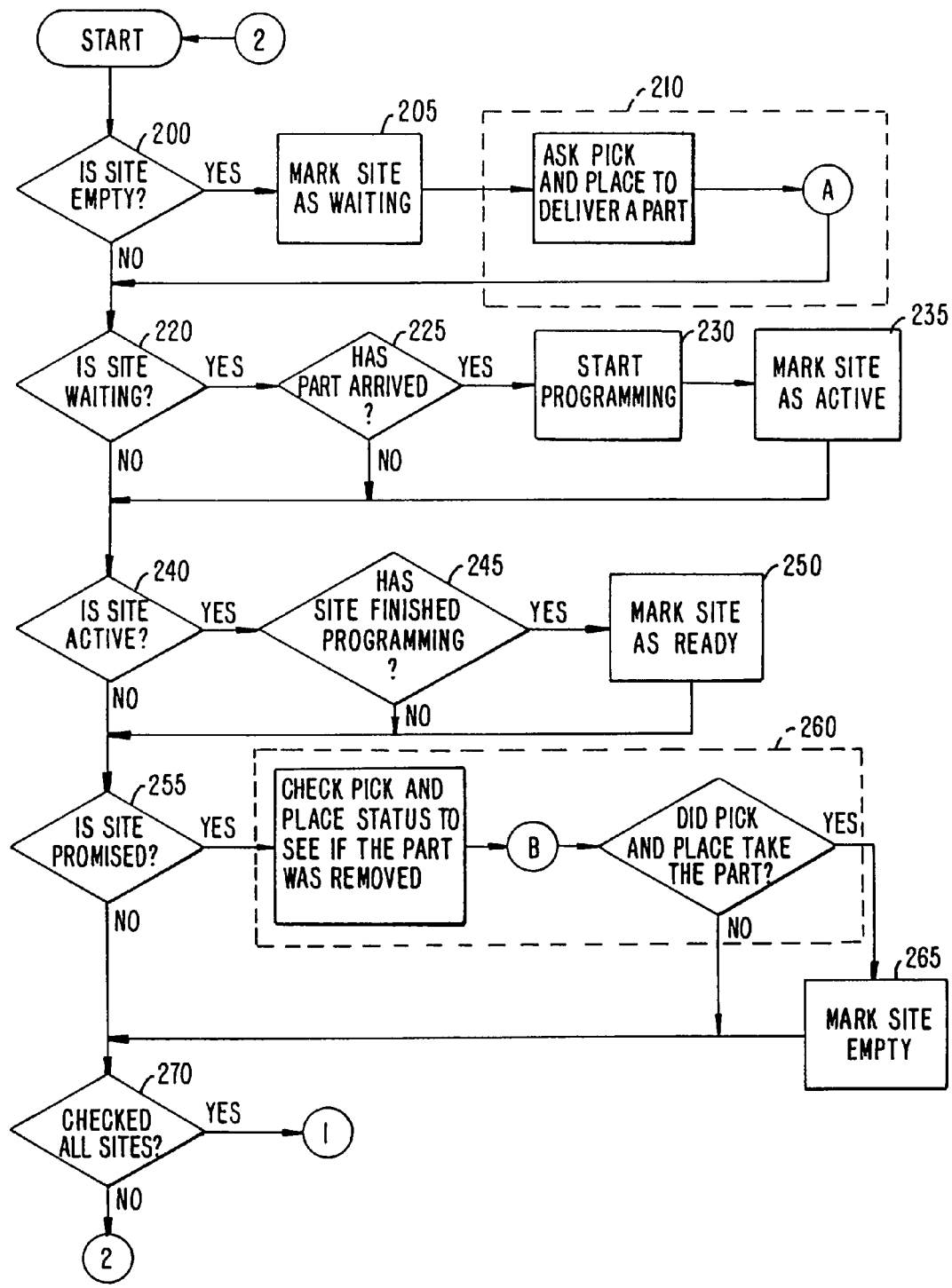
FIGS. 3a–b illustrate a flow chart showing the general operation of the concurrent programming system according to an embodiment of the present invention.
Figure 3B:
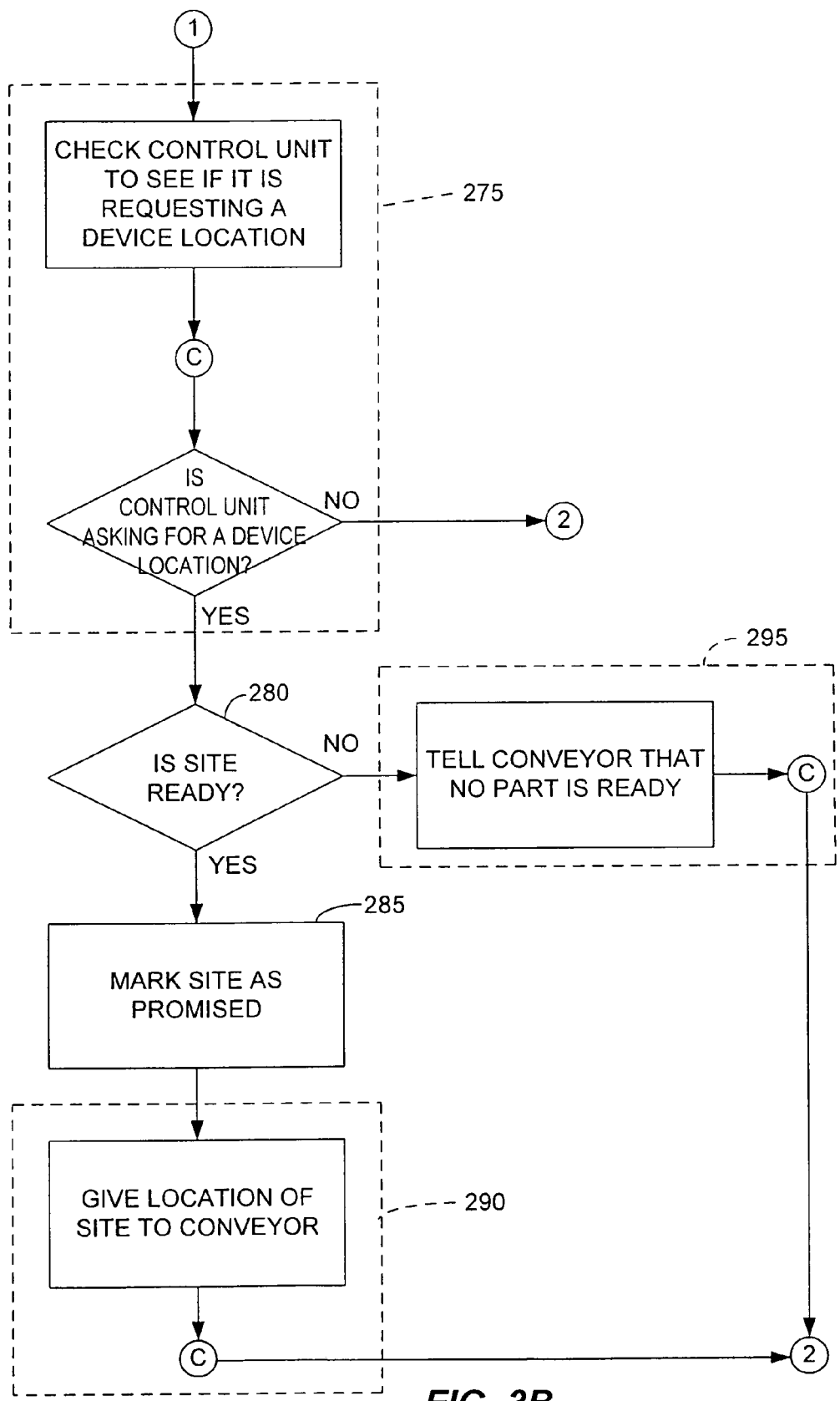

Once programming subsystem 100 has been configured for all programmable devices required by the boards to be processed, it is ordered by central control unit 130 to enter its processing loop, for example, as shown in FIGS. 3a–b. FIGS. 3a–b illustrate a flow chart showing the general operation of concurrent programming subsystem 100 according to an embodiment of the present invention. Concurrent programming subsystem 100 operates by running a loop that repeats continuously until the job is over (i.e., programming of all devices is completed). Initially, for each programming site, the system determines whether the site is in the EMPTY state in step 200. If the site is EMPTY, that site is transitioned to the WAITING state in step 205. Concurrent programming subsystem 100 then asks pick and place subsystem 120 to deliver a device to the specific site in step 210. (The "A" in step 120 indicates that data is provided to pick and place subsystem 120, e.g., data indicating the locations at which to pick up and to place the device as well as a status variable.) If the site is not EMPTY, in step 220 it is determined whether the site is in the WAITING state. If the site is not WAITING, the process proceeds to step 240. Otherwise, in step 225 it is determined whether a device has been delivered. If the site is WAITING, and a device has been delivered, device programming is initiated in step 230, and the site is transitioned to the ACTIVE state in step 235.

In step 240, it is determined whether the site is in the ACTIVE state. If the site is ACTIVE, it is determined whether the site has finished programming the device, and optionally whether the programmed device has been successfully tested (e.g., by applying voltages and waveforms to the programmed device) in step 245. If a device fails testing, the device is discarded and a new device is provided to concurrent programming subsystem 100. If programming has finished, the site is transitioned to the READY state in step 250. In step 255 the system determines whether the site is in the PROMISED state. If the site is PROMISED, concurrent programming subsystem 100 queries pick and place subsystem 120 to determine whether the device has been removed from the site in step 260. (The "B" in step 260 indicates that data is provided to and from pick and place subsystem 120.) If the programmed device has been removed, the site is transitioned to the EMPTY state in step 265.

In step 270, it is determined whether all sites have been checked. If all sites have not been checked, the process returns to beginning step 200 for the next site. If all sites have been checked, the process proceeds to step 275. With reference to FIG. 3b, in step 275, concurrent programming subsystem 100 determines whether central control unit 130 is requesting a device location (e.g., identification of any site handling the programming for a specific device type). (The "C" in step 275 indicates that data is provided to and from central control unit 130.) If central control unit 130 is not requesting a device location, the process proceeds to step 200. If central control unit 130 is requesting a device location, it is determined in step 280 whether any site handling the specific requested device type is in the READY state. If no site handling the specified device type is READY, in step 295, concurrent programming subsystem 100 provides a message to conveyor 110 indicating that no device is ready. The message may be provided directly to conveyor 110, or it may be relayed first to central control unit 130. The process then loops back to beginning step 200. If a site handling the specified device type is READY, the site is transitioned to the PROMISED state in step 285, and the location of that site's socket is provided to conveyor 110. (The "C"s in steps 290 and 295 indicate that data is provided to conveyor 110 either directly or through central control unit 130.) The process then loops back to beginning step 200.

Figure 4A:
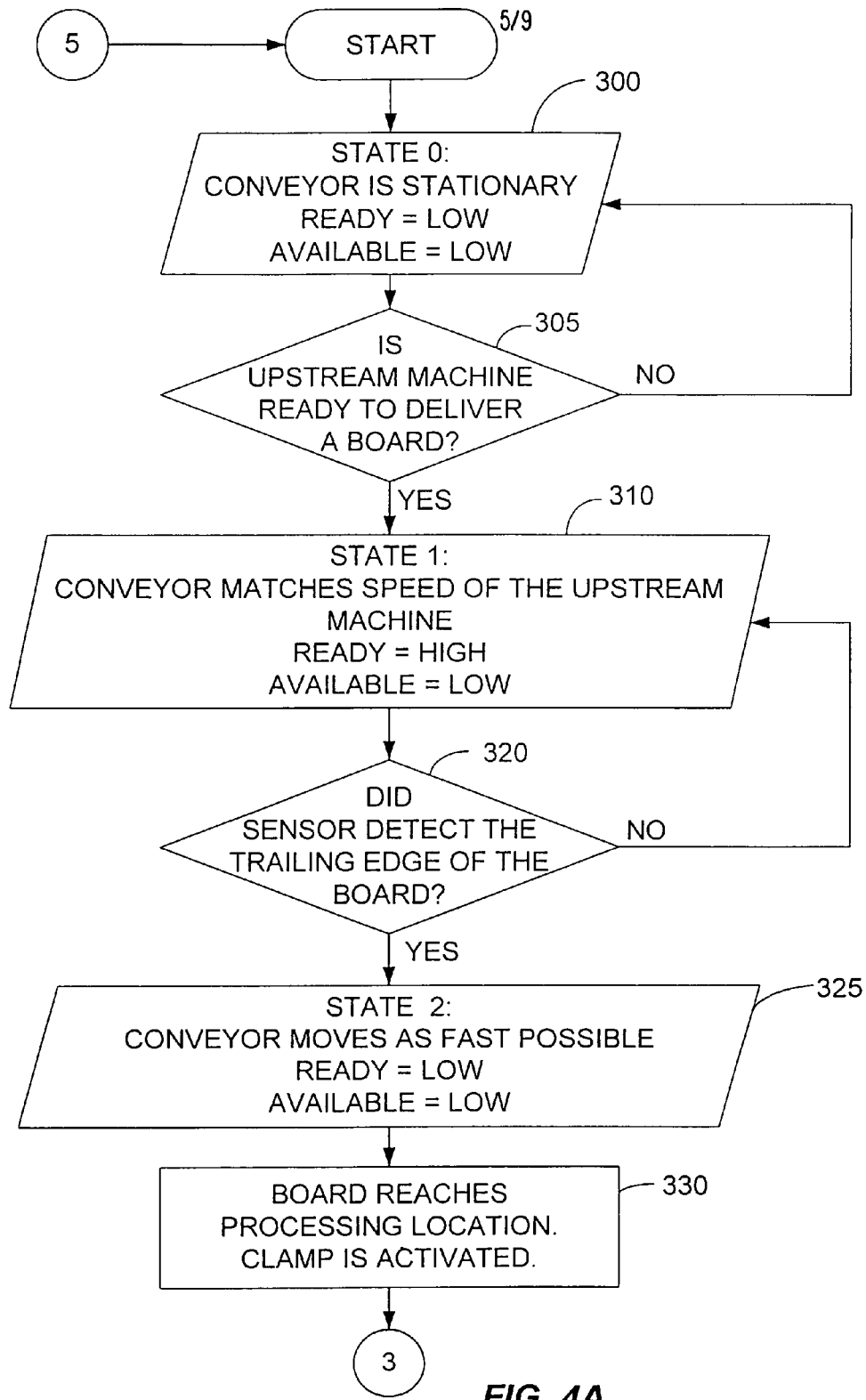
FIGS. 4a–c illustrate a flow chart showing the general operation of the conveyor system according to an embodiment of the present invention.
Figure 4B:
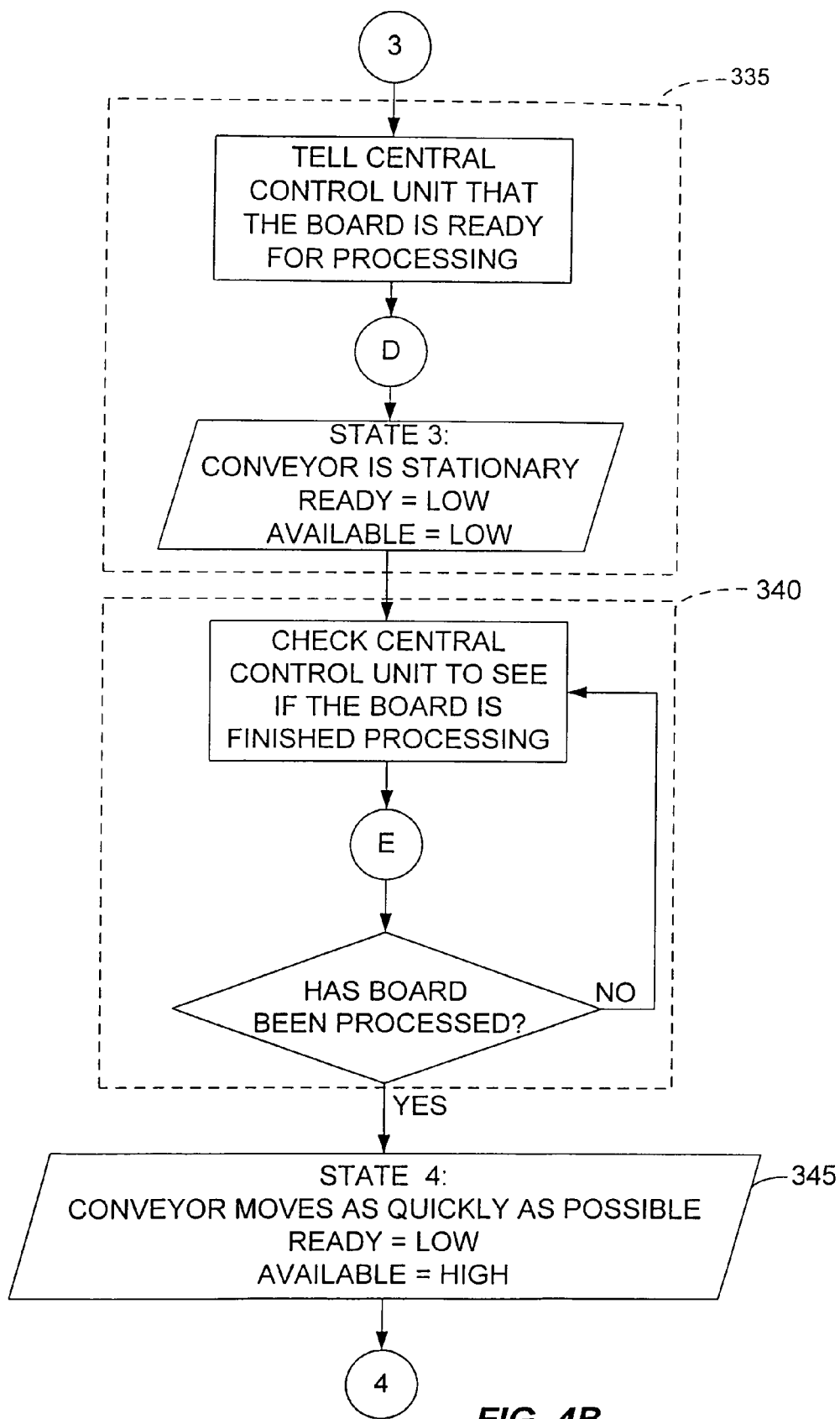
Figure 4C:
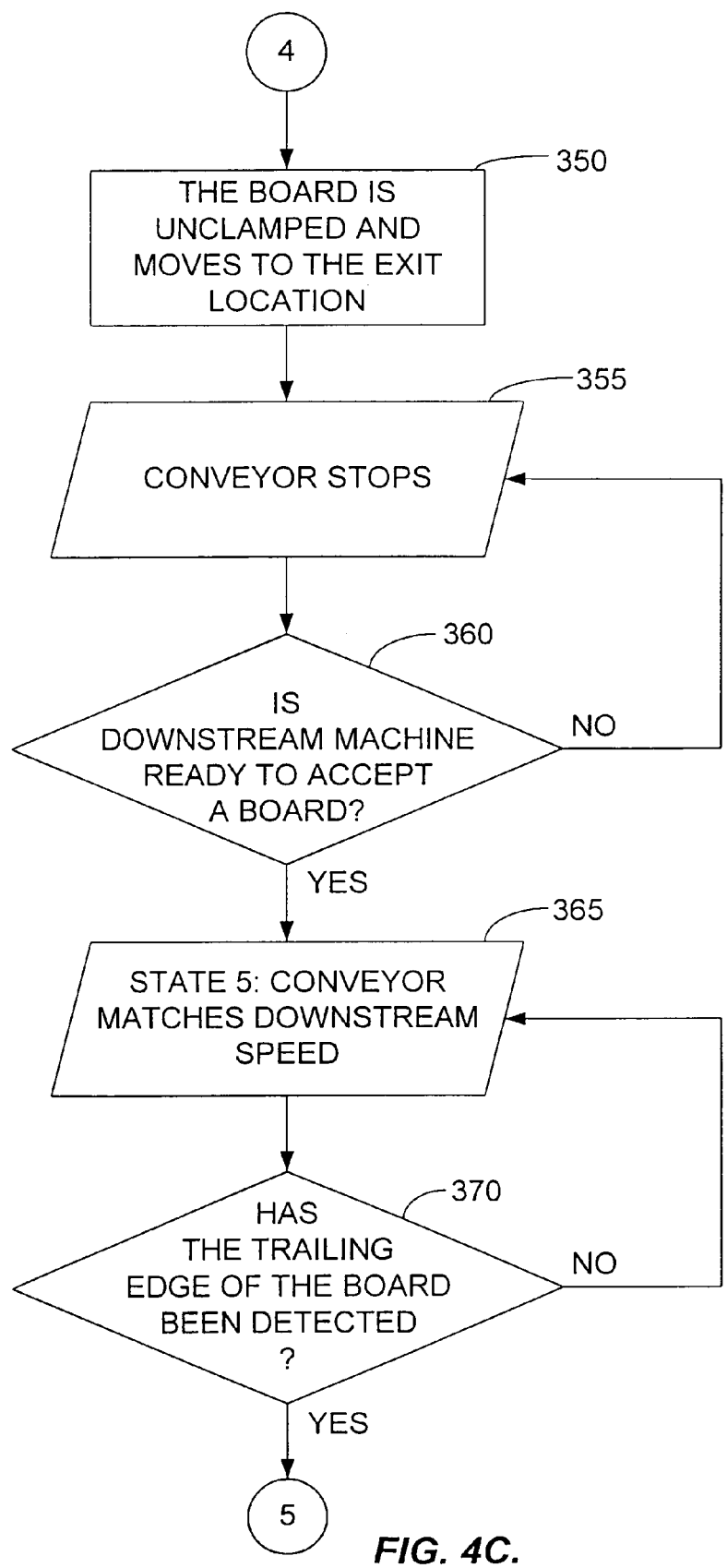

Conveyor subsystem 110 interacts with the upstream machine to bring printed circuit boards into ILP system 20. Conveyor subsystem 110 also interacts with the downstream machine to provide a printed circuit board assembly thereto. For example, as shown in FIG. 1, the conveyor system of inline programming system 20 interacts with the fine pitch placement machine 50 (i.e., upstream machine) to receive a printed circuit board to be processed, and with reflow oven 60 (i.e., downstream machine) to deliver a processed printed circuit board assembly thereto. Conveyor subsystem 110 also interfaces with central control unit 130, concurrent programming subsystem 100 and pick and place subsystem 120. In one embodiment, conveyor 110 uses four defined state variables to interact with the upstream and downstream machines: READY, AVAILABLE, UPAVAIL and DOWNREADY as it moves through its states of operation. In one embodiment, these state variables are binary variables having two states. The status variables are communicated between conveyor subsystem 110 and the upstream and downstream machines through the electrical connections provided between ILP system 10 and the upstream and downstream machines. Once conveyor subsystem 100 has been configured with velocity and acceleration limits, it is ordered by central control unit 130 to enter its processing loop to await the first board to be delivered. One example of such a processing loop is shown in FIGS. 4*a–c*.

In one embodiment, with reference to FIGS. 4*a–c*, conveyor subsystem 110 has six defined states of operation as follows:

State 0: In this state, the conveyor is waiting for the upstream machine to indicate that a board is ready for delivery. The conveyor is preferably stationary to avoid unnecessary wear and tear on the belt and other mechanical components. In step 300, READY is set to one state, e.g., low, to indicate that conveyor 110 is not ready to receive a board from the upstream machine, and AVAILABLE is set to one state, e.g., low, to indicate that conveyor 110 is not ready to deliver a printed circuit board assembly to the downstream machine. Conveyor 110 transitions in step 305 from state 0 to state 1 when the upstream machine sets UPAVAIL to one state, e.g., high, to indicate that it is ready to deliver a printed circuit board.

State 1: In this state, conveyor 110 is waiting to receive the board from the upstream machine. Conveyor 110 will match the speed of the conveyor on the upstream machine to allow a smooth transfer from one machine to the next. In step 310, READY is set high to indicate that conveyor 110 is ready to receive a printed circuit board. Conveyor 110 transitions from state 1 to state 2 in step 320 when the trailing edge of the board is detected by entry sensor 112.

State 2: In this state, conveyor 110 "owns" the board and may move the board as quickly as possible to the processing station location 116. A clamping mechanism is provided in one embodiment for clamping, or holding, the device in place at processing station location 116. In one embodiment, velocity and acceleration limits for conveyor 110 are preset by the system operator. In step 325, READY is set low to prevent the upstream machine from sending another board before the current board has finished processing. Once the board is at the processing station, in step 330, conveyor 110 stops moving and a clamp is activated to hold the board in place during processing. In step 335, central control unit 130 is notified by conveyor 110 that the board is ready for processing, and conveyor 110 transitions from state 2 to state 3. (The "D" in step 335 indicates that data is provided to central control unit 130.)

State 3: In this state, conveyor 110 is waiting for central control unit 130 to indicate that the processing of the board is completed. In step 340, conveyor 110 transitions from state 3 to state 4 when central control unit 130 indicates that the board is finished processing. (The "E" in step 340 indicates that data is provided to and from central control unit 130.) Processing is complete when all required programmed devices have been placed on the printed circuit board. Generally, one or more programmed devices are required for each printed circuit board assembly.

State 4: In this state, the assembled board is unclamped and conveyor 110 moves it as quickly as possible to the exit location (e.g., interface with downstream machine). In step 345, AVAILABLE is set high to indicate that conveyor 110 is ready to deliver an assembled board to the downstream machine. In step 350, the board is unclamped and moved toward the exit. In step 355, conveyor 110 stops movement until it is determined that the downstream machine is ready to receive the board in step 360. Conveyor 110 transitions from state 4 to state 5 when the downstream machine sets DOWNREADY to one state, e.g., high, to indicate that it is ready to receive a printed circuit board assembly.

State 5: In this state, in step 365, conveyor 110 matches the speed of the conveyor on the downstream machine to provide a smooth transfer from one machine to the next. Conveyor 110 remains in motion until, e.g., the trailing edge of the board is detected by exit sensor 114 in step 370. When the board has left conveyor 110, AVAILABLE is set low, and conveyor 110 stops motion and transitions from state 5 to state 0 (step 300) to wait for the next board to be processed from the upstream machine.

Pick and place subsystem 120 provides the ability to move devices from one location to another within the ILP system. In one embodiment, pick and place subsystem 120 includes self-teaching capability for determining the precise locations at which to pick and place devices. An example of such a pick and place system can be found in U.S. patent application Ser. No. 09/361,791, filed Jul. 27, 1999, entitled "Pick and Place Teaching Method and Apparatus for Implementing the Same," the contents of which are hereby incorporated by reference for all purposes.

Pick and place subsystem 120 services requests from concurrent programming subsystem 100 and conveyor 110 to move devices from one location to another. These requests may be received directly from concurrent programming subsystem 100 and conveyor 110, or through central control unit 130. The system making the request will provide the location from which to pick up a device, the location at which to place the device, and the address of a status variable. As one example, pick and place subsystem 120 can be directed to pick up an unprogrammed device, e.g., from a tray of unprogrammed devices, and place the device in a specific site's socket of concurrent programming subsystem 100 for processing. Blank devices may be provided to inline-programming apparatus 20 via device input interface 140 using a variety of media, including trays, tubes and tape as is well known. As another example, pick and place subsystem 120 can be directed to pick up a programmed device from concurrent programming subsystem 100 and place the programmed device on a printed circuit board at a specific location on conveyor 110. Pick and place subsystem 110 queues the requests and services them as soon as possible. The caller can monitor the status variable for the following states: Not yet ready, Underway, Finished successfully, and Finished with an error. Pick and place subsystem 110 performs one move after another until the job is completed. If the queue becomes empty, pick and place subsystem 110 will wait idly until another request is made. The operation of pick and place subsystem 110 is described in more detail with reference to FIG. 5.

Figure 5:
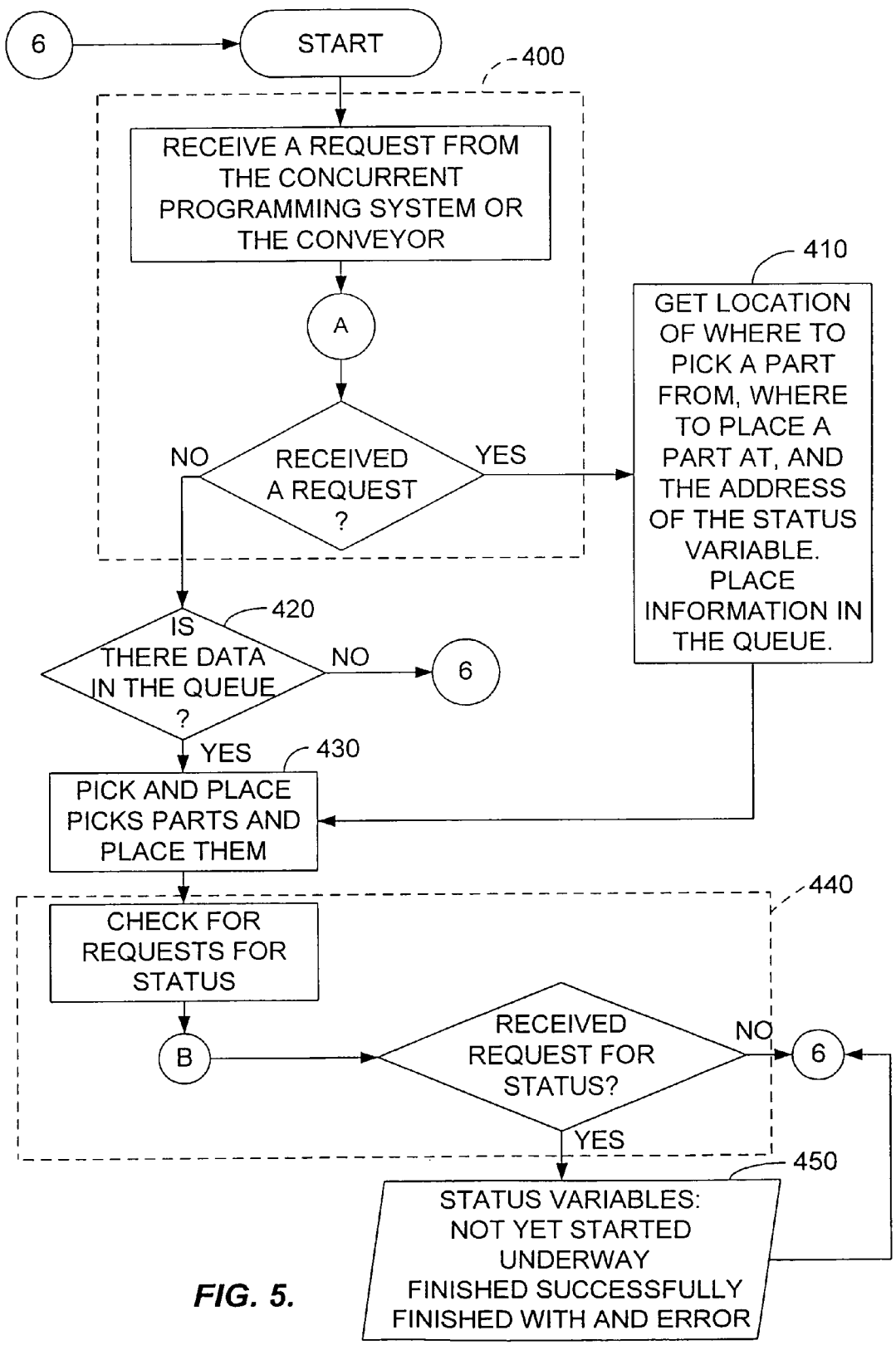
FIG. 5 illustrates a flowchart showing the general operation of the pick and place system according to an embodiment of the present invention.

FIG. 5 illustrate a flowchart showing the general operation of pick and place subsystem 110 according to an embodiment of the present invention. In step 400, pick and place subsystem 120 determines whether a request is received from concurrent programming subsystem 100 or from conveyor subsystem 110 to pick and place a device. (The "A" in step 400 indicates that data is provided to pick and place subsystem 120.) The entity requesting that a device be brought to it calls pick and place subsystem 120 and provides the location and status address information. If such a request is received, in step 410, the system places the location information and the associated status variable address in a queue and proceeds to step 430. In one embodiment, the queue is implemented in a memory, such as a FIFO buffer. If no request is received, pick and place subsystem 120 checks to see whether any data is stored in the queue. If data is stored in the queue the process proceeds to step 430, and if no data is stored in the queue, the process loops back to beginning step 400.

In step 430, pick and place subsystem 120 reads the data in the queue having the highest priority, and proceeds to pick and place the requested part at the specified locations. In step 440, the system determines whether any status requests have been made. (The "B" in step 440 indicates that a request is provided to pick and place subsystem 120.) If status variables are requested, the system provides them to the requesting entity in step 450. The process then loops back to beginning step 400.

Central control unit 130 coordinates the action of the other system components as described in more detail below. Central control unit 130 is preferably implemented as an industry standard Pentium-based personal computer executing the Microsoft Windows operating system, although any other processor and any other operating system may be used as desired. As part of its function, central control unit 130 coordinates the delivery of unprogrammed devices to concurrent programming subsystem 100 for programming, as well as the placement of programmed devices on the circuit boards. The operation of the central control unit is described in more detail with reference to FIG. 6.

Figure 6:
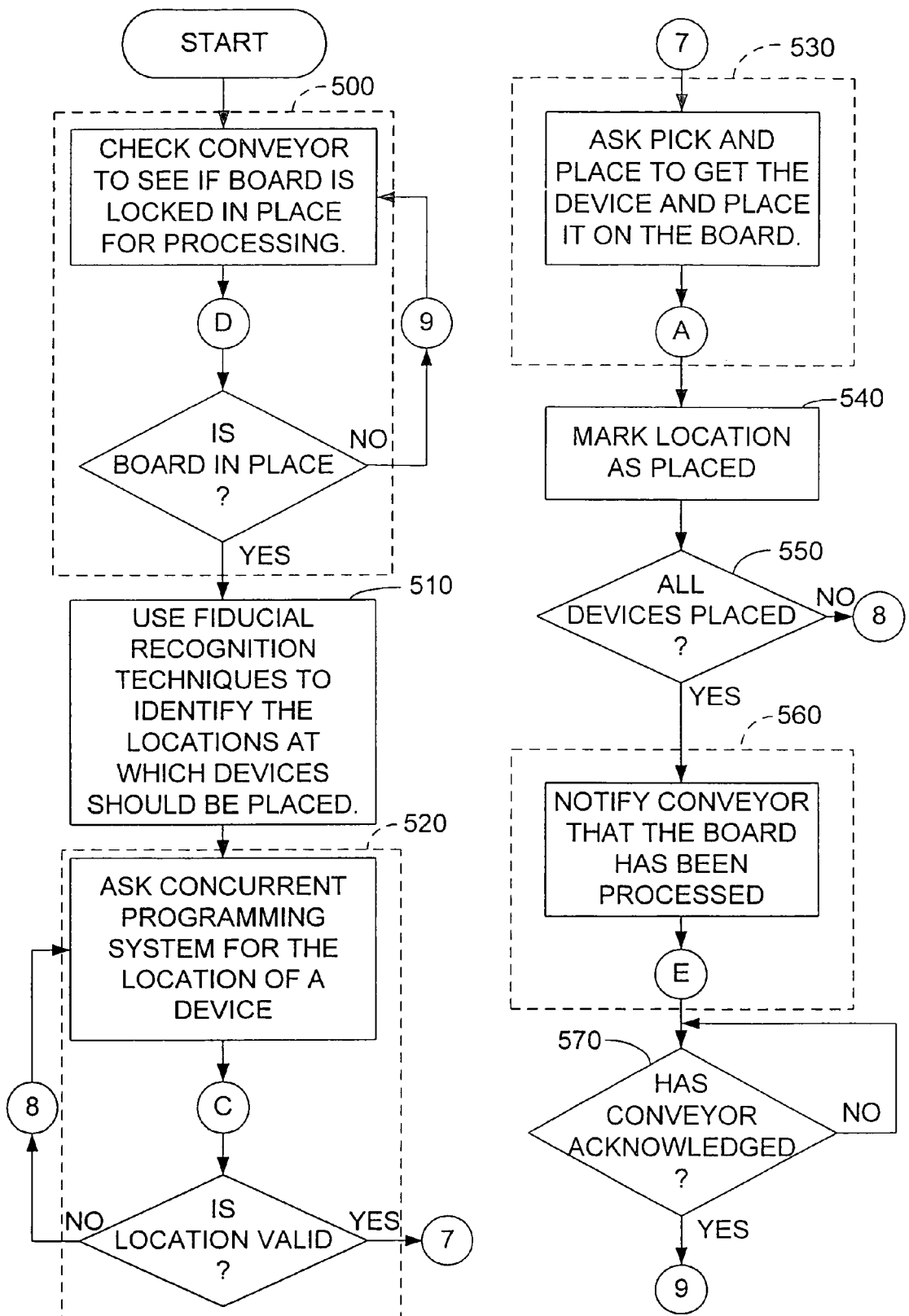
FIG. 6 illustrates a flowchart showing the general operation of the central control unit according to an embodiment of the present invention.

FIG. 6 illustrates a flowchart showing the general operation of central control unit 130 controlling the operation of placing programmed devices on a printed circuit board according to an embodiment of the present invention. In step 500, central control unit 130 checks whether conveyor 110 has indicated that a board in locked in place and ready for processing. (The "D" in step 500 indicates that data is provided to and from central control unit 130.) If a board is locked in place, in step 510 fiducial recognition techniques are used to identify the locations at which one or more programmed devices should be placed. In general, the boards will not be clamped in precisely the same locations in station location 116. Once clamped down, the board will not move, but the clamped positions will vary slightly from board to board. In one embodiment, a camera is used to detect the location of a pair of "fiducial marks", e.g., small circles or cross marks on the board to determine the location and orientation of the board. This location information is used in conjunction with the known board location(s) (e.g., where the device(s) are to be placed on the board), by the pick and place subsystem 120 to compute the exact location, and orientation, at which to place a device on the board. In step 520, control unit 130 queries concurrent programming subsystem 100 for the location of a programmed device. (The "C" in step 520 indicates that data is provided to and from central control unit 130.) If the location is valid, the process proceeds to step 530. If not, the process loops back (indicated by the "8") and queries the concurrent programming subsystem 100 for a device location.

In step 530, central control unit 130 instructs pick and place subsystem 120 to pick and place the device identified by concurrent programming system in step 520. (The "A" in step 530 indicates that location and status data is provided to and from pick and place subsystem 120.) After the device has been placed on the board, the specific location is marked as PLACED. In step 550, the unit determines whether all devices required to be placed on the board have been placed thereon. If not, the process loops back (indicated by the "8") to step 520 where the central control unit queries concurrent programming subsystem 100 for the location of the next device to be placed. If all devices have been placed, in step 560, central control unit 130 notifies conveyor subsystem 110 that the board has been processed and can be moved on. (The "E" in step 530 indicates that data is provided to and from conveyor subsystem 110.) In step 570, central control unit waits until conveyor subsystem 110 acknowledges that the board has been processed and then reverts back to beginning step 500 to coordinate processing for the next board.

According to one embodiment, in-line programming apparatus, and all of its components are operator configurable using computer code run on central control unit 130. Computer code for operating and configuring all components of in-line programming apparatus as described herein is preferably stored on a hard disk coupled to central control unit. The entire program code, or portions thereof, may also be stored in any other memory device such as a ROM or RAM, or provided on any media capable of storing program code, such as a compact disk medium, a floppy disk, or the like.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A system for use within a surface mount production line having a conveyor for receiving a printed circuit board, and for moving the printed circuit board through the surface mount production line, the system comprising:

a concurrent programming system containing first and second programming sites;

a pick and place system for picking up first and second electronic devices from one or more tray shuttles, and for placing the first and second electronic devices within the first and second programming sites, respectively, the first and second electronic devices being programmable in a concurrent manner and independent of each other; and a central control unit for communicating with the conveyor, the concurrent programming system, and the pick and place system, the central control unit directing the conveyor to move the printed circuit board permitting the pick and place system to place the first and second electronic devices on the printed circuit board after the devices are programmed;

wherein the conveyor system is controlled according to state variables associated with receiving a printed circuit board from an upstream device and providing an assembled printed circuit board assembly to a downstream device, and wherein the state variables include one or more of a first variable indicating that the upstream device is ready to deliver the printed circuit board, a second variable indicating that the downstream device is ready to receive the assembled printed circuit board assembly, a third variable indicating that the conveyor system is ready to receive the printed circuit board, and a fourth variable indicating that the conveyor system is ready to deliver the assembled printed circuit board assembly.

2. The system of claim 1 wherein the concurrent programming system further comprises a controller for each of the first and second programming sites for independently programming each of the first and second programming sites.

3. The system of claim 2 wherein the pick and place device further comprises a controller for servicing requests from the concurrent programming system and the conveyor.

4. The system of claim 3 wherein the system making a request provides the location from which to pick up a device.

5. The system of claim 1 further comprising tracks or rails enabling movement of the pick and place device within the system.

6. The system of claim 1 further comprising one or more sensors for detecting when the conveyor delivers a printed circuit board to the system.

7. The system of claim 1 further comprising four parallel asynchronous processes upon which operations of the system depend.

8. The system of claim 1 wherein the pick and place device includes self-teaching capability for determining the precise locations at which to pick and place the first and second programmable devices.

9. The system of claim 1 further comprising employing fiducial recognition techniques to determine the location at which the programmable device is to be placed.

* * * * *